(12) United States Patent
Johnson, III et al.

(10) Patent No.: US 10,514,391 B2
(45) Date of Patent: Dec. 24, 2019

(54) RESISTIVITY PROBE HAVING MOVABLE NEEDLE BODIES

(71) Applicant: KLA-Tencor Corporation, Milpitas, CA (US)

(72) Inventors: Walter H. Johnson, III, Rocklin, CA (US); Nanchang Zhu, Shanghai (CN); Xianghua Liu, Shanghai (CN); Jianli Cui, Shanghai (CN); Zhu-bin Shi, Shanghai (CN); Zhuoxian Zhang, Shanghai (CN); Haiyang You, Shanghai (CN); Lu Yu, Shanghai (CN); Jianou Shi, Palo Alto, CA (US); Fan Zhang, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 135 days.

(21) Appl. No.: 15/665,730

(22) Filed: Aug. 1, 2017

(65) Prior Publication Data

US 2018/0052189 A1    Feb. 22, 2018

Related U.S. Application Data

(60) Provisional application No. 62/378,161, filed on Aug. 22, 2016.

(51) Int. Cl.
| G01R 31/00 | (2006.01) |
| G01R 1/067 | (2006.01) |
| G01R 1/073 | (2006.01) |
| G01R 31/28 | (2006.01) |

(52) U.S. Cl.
CPC ..... *G01R 1/06761* (2013.01); *G01R 1/06722* (2013.01); *G01R 1/07307* (2013.01);
(Continued)

(58) Field of Classification Search
CPC ............ G01R 1/06722; G01R 1/07307; G01R 1/07342; G01R 1/067; G01R 31/2886;
(Continued)

(56) References Cited

U.S. PATENT DOCUMENTS

| 5,066,907 A | 11/1991 | Tarzwell et al. |
| 5,347,226 A | 9/1994 | Bachmann et al. |

(Continued)

OTHER PUBLICATIONS

ISA/KR, International Search Report for PCT/US2017/047622 dated Dec. 20, 2017.
(Continued)

*Primary Examiner* — Vinh P Nguyen
(74) *Attorney, Agent, or Firm* — Hodgson Russ LLP

(57) ABSTRACT

Resistivity probes can be used to test integrated circuits. In one example, a resistivity probe has a substrate with multiple vias and multiple metal pins. Each of the metal pins is disposed in one of the vias. The metal pins extend out of the substrate. Interconnects provide an electrical connection to the metal pins. In another example, a resistivity probe has a substrate with a top surface and multiple elements extending from the substrate. Each of the elements curves from the substrate to a tip of the element such that each of the elements is non-parallel to the top surface of the substrate.

8 Claims, 16 Drawing Sheets

(52) U.S. Cl.
CPC ..... *G01R 1/07314* (2013.01); *G01R 31/2831* (2013.01); *G01R 31/2886* (2013.01)

(58) Field of Classification Search
CPC .............. G01R 31/2889; G01R 1/0416; G01R 1/06711; G01R 1/07314; G01R 1/073; G01R 1/0408; G01R 1/0466; G01R 31/26; G01R 1/00; G01R 1/04; G01R 1/0491; G01R 1/20; G01R 31/002; G01R 31/31905; G01R 1/06794; G01R 21/06; H01R 2201/20; H01R 13/2421; H01R 12/714; H01R 13/2428; H01R 12/91; H01R 24/52; H01R 9/0512; H01R 9/0515; H01R 9/0518

See application file for complete search history.

(56) References Cited

U.S. PATENT DOCUMENTS

| | | | |
|---|---|---|---|
| 5,389,885 A * | 2/1995 | Swart | G01R 1/07307 324/754.14 |
| 5,762,504 A | 6/1998 | Itoh | |
| 7,304,486 B2 | 12/2007 | Petersen et al. | |
| 7,323,890 B2 | 1/2008 | Petersen et al. | |
| 9,470,715 B2 * | 10/2016 | Fan | G01R 1/07357 |
| 2005/0046431 A1 | 3/2005 | Kirby | |
| 2008/0122470 A1 * | 5/2008 | Lu | G01R 1/07342 324/755.01 |
| 2011/0031990 A1 | 2/2011 | Patterson | |
| 2012/0068727 A1 | 3/2012 | Rathburn | |
| 2012/0319710 A1 | 12/2012 | Dabrowiecki et al. | |

OTHER PUBLICATIONS

Hong, et al., Cantilever Beam Micro-Contacts in a Multi-Chip Interconnection System, Electronic Manufacturing Technology Symposium, 1989, Proceedings. Seventh IEEE/CHMT International, pp. 239-245 Sep. 25, 1989.

Abraham, et al., Rapid-turnaround characterization methods for MRAM development, IBM Journal of Research and Development, vol. 50, No. 1, pp. 55-67 Jan. 1, 2006.

* cited by examiner

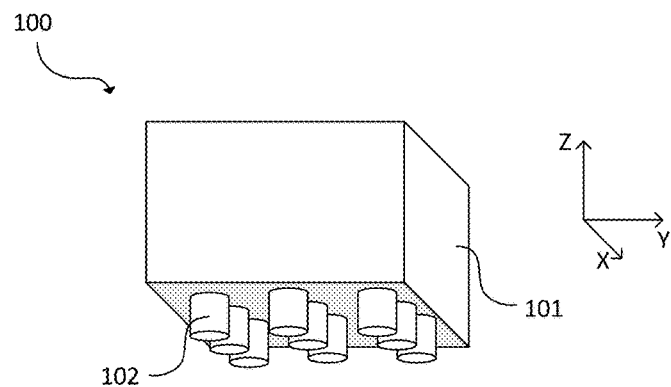
FIG. 1
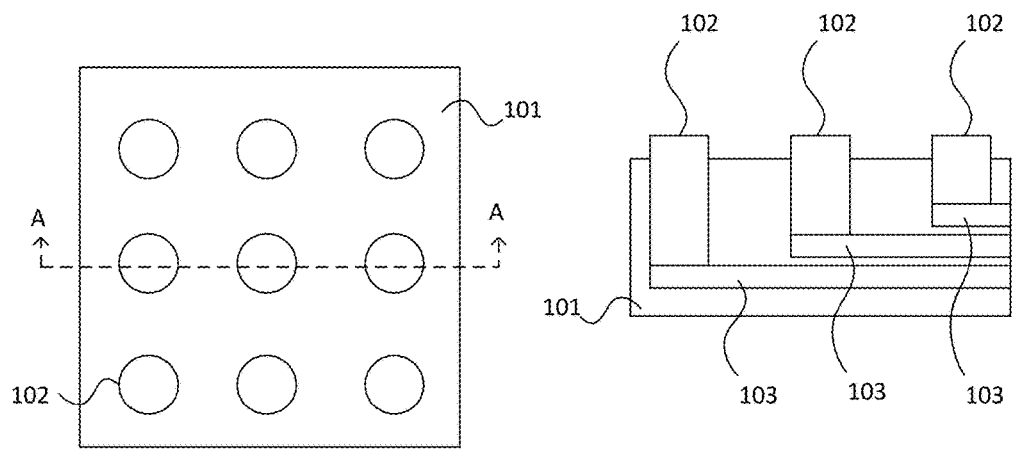
FIG. 2
FIG. 3

RESISTIVITY PROBE HAVING MOVABLE NEEDLE BODIES

CROSS-REFERENCE TO RELATED APPLICATIONS

This application claims priority to the provisional patent application filed Aug. 22, 2016 and assigned U.S. App. No. 62/378,161, the disclosure of which is hereby incorporated by reference.

FIELD OF THE DISCLOSURE

This disclosure relates to resistivity probes.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

It is necessary to test integrated circuits as part of the manufacturing process. The testing is performed by creating a temporary electrical contact between a test probe or probes with selected points on the integrated circuit or witness sample being tested. A predetermined programmed test is then undertaken utilizing signals applied to the circuit and derived therefrom through the probes. Because of the complexity and the small size of the circuits, particularly extremely compact integrated circuits, the numbers of contacts that must be made with the circuit for appropriate testing demands strict control over the positioning of contact probes. Furthermore, the force with which the probes are placed against the predetermined circuit pads or points may be important. Controlling the precise positioning of the probes as well as the force on each probe requires accuracy in the manufacture of probe systems.

Such probe systems have typically used probes that are normally in the form of fine needles. The probes are individually attached to a printed circuit board by either soldering the probe directly to the printed circuit board or to a holding device which in turn is soldered to the printed circuit board. The probes typically extend from the mounting place, such as the blade, in a cantilever arm fashion reaching out as much as several hundred mils to the point on the integrated circuit to be tested. To change the force on the probe requires either changing the probe diameter to make the probe stiffer or more flexible, or changing the probe length or cantilever length. Furthermore, the use of such probes does not provide a convenient means for implementing a controlled impedance transmission line.

In an instance, a four-point probe can be used to test the electric properties of an integrated circuit by generation of resistivity or carrier concentration profiles of the surface of a processed semiconductor wafer. A conventional four-point probe technique typically has the points positioned in an in-line configuration. By applying a current to the two peripheral points, a voltage can be measured between the two inner points of the four-point probe. Thus the electric resistivity ρ of the test sample can be determined through the equation ρ=c(V/I), wherein V is voltage measured between inner points, wherein I is current applied to the peripheral points and, wherein c is a geometry factor depending on the surface contact separation d and the dimensions of the test sample.

Conventionally probe tips are made by planar microelectromechanical systems (MEMS) manufacturing processes. The probe cantilevers extend out parallel to the supporting body surface, which is referred to as planarity, for easy manufacturing as well as simultaneous landing on a flat wafer surface. When the cantilever makes contact with wafer surface, it bends and scrubs with wafer surface and form a sizeable contact. The contact size is relevant to the contact force and probe wear. This design eventually loses conductive materials, loses the capability for passing electric current thereby limiting precision of the measurement, and shortens the lifetime of the probe. Due to the co-planarity of probe tip to the supporting chip surface, and the angle about 30° between the cantilevered probes to wafer surface, the contact size is variable related to probe tip wear, and the conductive coating can be easily removed during landing and measurement. A change of contact size and removal of conductive coating will deteriorate the measurement accuracy, shortening probe lifetime significantly.

The metal coating deforms and quickly wears off on existing probes, which results in an approximate lifetime of 100-500 touches or measurements. The fragile $SiO_2$ cantilevers also can easily break. Therefore, improved resistivity probe designs are needed.

BRIEF SUMMARY OF THE DISCLOSURE

In a first embodiment, a resistivity probe is provided. The resistivity probe comprises a substrate defining a plurality of vias, a plurality of metal pins in one or more rows, and a plurality of interconnects in the substrate. Each of the metal pins is disposed in one of the vias. Each of the metal pins extends out of the substrate. The interconnects provide an electrical connection to the metal pins.

An arm can be included. The substrate can be disposed on the arm. A platen also can be included. The arm can be configured to move the substrate toward and away from the platen.

The metal pins can be fabricated of tungsten, tungsten carbide, a tungsten-rhenium alloy, a beryllium-copper alloy, or an alloy containing gold, palladium, platinum, silver, copper, and zinc.

The resistivity probe can include a plurality of springs. Each of the metal pins may include one of the springs.

The pins may be in an array having at least two rows. Each of the rows includes at least two metal pins.

In an instance, the resistivity probe includes a plurality of needle bodies, a plurality of conductive wires, an enclosure, and a fluid source. Each of the metal pins is disposed on one of the needle bodies. Each of the needle bodies includes a main body and a shoulder portion. Each of the conductive wires is disposed on one of the needle bodies. Each of the needle bodies is positioned to extend through a wall of the enclosure. The fluid source is configured to direct a fluid into the enclosure. The needle bodies are configured to move through the enclosure upon exposure to the fluid. One of the shoulders is configured to halt movement of the needle body that the shoulder is disposed on. The resistivity probe can further include an arm that the enclosure is disposed on. A platen also can be included. The arm can be configured to move the enclosure toward and away from the platen.

In a second embodiment, a method is provided. A hole is etched in a base material of a substrate. A wall of the through hole defines a cap stop. The wall of the through hole is lined with a release layer. Metal is deposited in the through hole and cap stop. The metal is planarized such that the metal is flush with the base material thereby forming a pin. The release layer is etched.

The method can further include lining the metal with the release layer after the planarizing and depositing a conductor on the release layer prior to the etching. The conductor and the metal are independent of each other after the etching.

The method can further include depositing a conductor on the metal and the release layer after the planarizing and prior to the etching. The metal and the conductor are in contact after the etching. The tip of the metal at a point opposite the conductor may be etched.

Forming the pin can further comprise depositing an insulator on the through hole and cap stop prior to the lining. The tip of the metal at a point opposite the conductor may be etched. The base material may be grounded and/or a ground layer can be deposited surrounding the conductor.

In a third embodiment, a resistivity probe is provided. The resistivity probe comprises a substrate defining a top surface and a plurality of probes extending from the substrate. Each of the probes curves from the substrate to a tip of the probe such that each of the elements is non-parallel to the top surface of the substrate.

Each of the probes can includes two layers of material. The two layers have different stresses thereby causing the curve.

The substrate can include a support region that matches a curve of the probes. The support region of the substrate is etched away.

DESCRIPTION OF THE DRAWINGS

For a fuller understanding of the nature and objects of the disclosure, reference should be made to the following detailed description taken in conjunction with the accompanying drawings, in which:

FIG. 1 is a perspective view of an embodiment of a resistivity probe in accordance with the present disclosure;

FIG. 2 is a bottom view of the resistivity probe of FIG. 1;

FIG. 3 is a cross-sectional view of the resistivity probe of FIG. 1 along line A-A in FIG. 2;

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the resistivity probes disclosed herein can be used for determining sheet resistance in limited spaces like test pads on a semiconductor wafer. Embodiments of the resistivity probes disclosed herein also can be used to characterize magnetic random access memory (MRAM) stacks by using four-point probe measurements at several different pin spacing via current in-plane tunneling (CIPT) or other techniques. Other devices on an integrated circuit also may be tested. The pins disclosed herein have improved wear characteristics and can increase the lifetime of the resistivity probe by several hundred percent. The vertical pin motion eliminates the scrubbing action of the cantilever method, which further reduces wear and eliminates breaking from over-flexing. The use of air pressure can eliminate pin force variation caused by landing height or pin planarity variations. Vertical compliance can be substantially increased, which can make the landing method less critical.

FIG. 1 is a perspective view of an embodiment of a resistivity probe 100. FIG. 2 is a bottom view of the resistivity probe 100 of FIG. 1. FIG. 3 is a cross-sectional view of the resistivity probe 100 of FIG. 1 along line A-A in FIG. 2. The pins 102, which may be fixed in place in an instance, are positioned in a surface of a body 101 of the resistivity probe 100. The body 101 may be silicon. The pins 102 can be solid metal. The pins 102 can be stationary within a body 101 or can be displaced vertically using a separate spring force. Each of the pins 102 can be positioned in a via through the body 101. The via can extend entirely through the body 101 or only partly through the body 101.

Figure 5A:
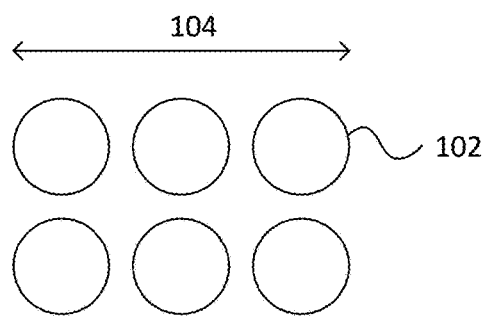
FIGS. 5A-5C illustrate pin configurations.
Figure 5B:
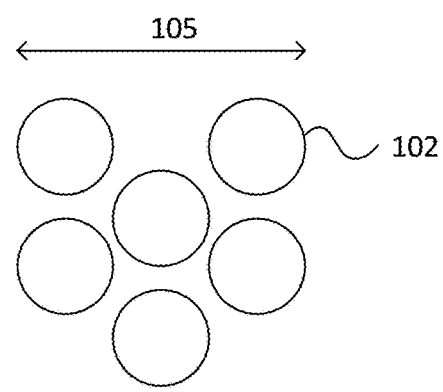
Figure 5C:
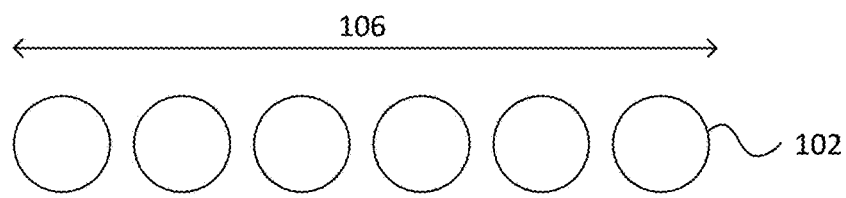

Nine pins 102 are illustrated. The resistivity probe 100 may include more or fewer pins 102 than illustrated in FIG. 1. The pins 102 may be in one or more rows. For example, twelve pins 102 may be included. Different arrangements of pins 102 from that illustrated in FIGS. 1 and 2 are possible. More or fewer rows or series can be included. FIG. 5A-5C illustrate various examples of pin configurations. As seen in FIGS. 5A-5C, the distance 106 is greater than the distance 104, which is greater than the distance 105. Thus, multi-row array (like in A) or staggered array (like in B) can provide a smaller depth of penetration for a given minimum feature size than a single row of pins (like in C).

Turning back to FIGS. 1-3, each of the pins 102 may have a planar tip. The dimensions of the tips can be on the micron scale. Minimum spacing of approximately 0.1 microns may be used, though other dimensions are possible.

Instead of being fixed, each of the pins 102 may be positioned on a spring.

Instead of being fixed, each of the pins 102 also may use air pressure as a spring. The pins 102 or the body 101 can serve as a piston. This can enable programmable pin 102 pressure. For example, the air pressure can increase until Ohmic contact is made with the pins.

When pins 102 move relative to the body 101, then the pins 102 can conform to uneven surfaces, such as warped wafers. A change in height of the pin 102 can cause a change in deflection that may appreciably change the tip force but the air pressure version will maintain constant pressure between pins 102. There may be some coordination between stop height and pin height variation.

The spacing between the pins 102 can vary depending on the application.

Figure 4:
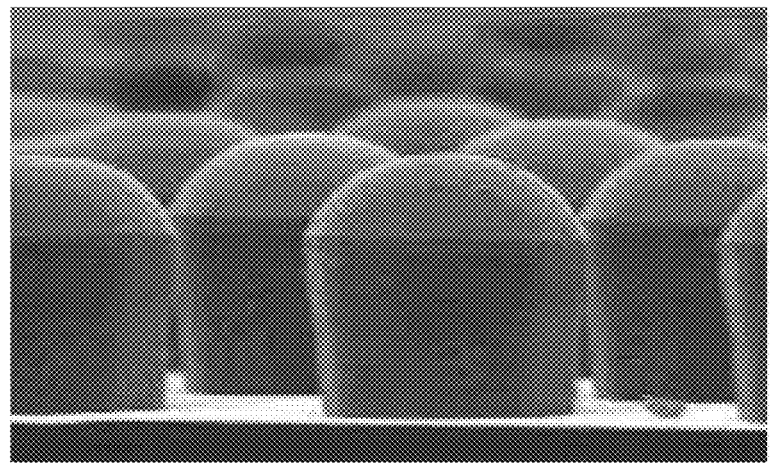
FIG. 4 illustrates an embodiment of pins for the resistivity probe of FIG. 1.

FIG. 4 illustrates an embodiment of pins for the resistivity probe 100 of FIG. 1. The pins illustrated in FIG. 4 have rounded tips, unlike the flat tips illustrated in FIG. 1. The pins can have a sub-micro pitch and improved durability. The pins can be configured for both magnetic tunnel junctions (MTJ) CIPT and implants. While illustrated as rounded in FIG. 4, the shape of the tip of pins can vary from pointed to rounded to flat. Pointed can provide good penetration, but may have limited current carrying capability. Rounded can increase contact area and contact resistance as well as reducing penetration. Flat can give the largest contact area and carry the most current, but may have low penetration which is limited for surfaces that oxidize.

Turning back to FIG. 1, the pins 102 may be configured to provide limited motion in the Z direction. This may prevent or reduce the need for scrubbing. Scrubbing can aid in penetration through a top barrier layer (e.g., an oxide). Scrubbing also can increase foot print, increase particles, increase amount of tip contamination from the surface being probed, and increase contact resistance from loose particles. Silicon may be especially prone to loose particles and increased contact resistance. One possible mechanism is that material piles up from scrubbing the pin and rests on the pile or a particle thereby increasing contact resistance. Other mechanisms may be possible.

Scrubbing may be avoided unless there are limited options to break through a surface layer on the pins 102, such as with roughness. Roughness can include use of a large grain material, such as tungsten carbide, that includes micro penetration points. Any scrubbing for cleaning the tips of the pins 102 may be performed off the sample.

In an instance, the pins 102 can provide a minimum 100,000 contact lifetime. A sharper tip may wear more quickly. A flat tip surface may minimize wear, and if the pin 102 has vertical side walls it will not change contact area as the pin 102 wears. Lifetimes also can be extremely long for hard metals. Tungsten carbide pins 102 can be constructed so that the pin 102 surface area will not change with several million contacts.

The pins 102 can provide a constant contact force independent on Z height. The pins 102 also can provide a constant contact area over pin life.

The electrical contact of the pins 102 may include one or more of the following properties. The pins 102 can provide low Ohmic contact, which may be below 100 Ohm-cm$^2$. The pins 102 may have the ability to penetrate blocking layers. The pins 102 may be non-contaminating, self-cleaning, and/or non-scrubbing. Controllable contact pressure (e.g., mechanical spring or air pressure) can be provided using the pins 102. All pins 102 may be able to contact the sample surface with the same pressure.

The resistivity probe 100 can miniaturize the vertical pin design of a four-point probe methodology. For example, a size of the resistivity probe 100 may be more than 1,000 times smaller than commercial vertical four-point probes.

The pins 102 can be fabricated of tungsten, tungsten carbide, a tungsten-rhenium alloy, a beryllium-copper alloy, or an alloy containing gold, palladium, platinum, silver, copper, and zinc. Other metals, alloys, or materials for the pins 102 are possible. See the following table for properties of some exemplary materials for the pins 102.

| Properties | Tungsten | Tungsten-Rhenium | Paliney ®7 | Beryllium-Copper |
|---|---|---|---|---|
| Physical Properties | | | | |
| Density (gm/cm$^3$) | 19.24 | 19.29 | 11.81 | 8.35 |
| Electrical Properties | | | | |
| Resistivity at 20° C. (μΩ-cm) | 5.59-5.86 | 9.15-9.65 | 30.9-34.9 | 6.10-7.93 |
| Conductivity at 20° C. (1/MΩ-cm) | 0.179-0.170 | 0.109-0.104 | 0.032-0.29 | 0.131-0.126 |
| Thermal Properties | | | | |
| Melting Point (° C.) | 3410 | 3108 | 1015 | 870-980 |
| Coeff. of Lin. Exp. (0 to 500° C.) (mm/mm × 1/° C.) | $4.45 \times 10^{-6}$ | $4.92 \times 10^{-6}$ | $13.5 \times 10^{-6}$ | $17.8 \times 10^{-6}$ |
| Material Properties | | | | |
| Elastic Modulus (Gpa) | 394.5 ± 6.1 | 395.7 ± 6.4 | 121.2 ± 4.9 | 131.5 ± 5.5 |
| Tensile Yield Strength (Gpa) | 2.65-2.90 | 2.90-3.36 | 0.65-0.93 | 1.38-1.64 |
| Ultimate Tensile Strength (Gpa) | 4.25-4.85 | 5.00-5.75 | 0.97-1.17 | 2.70-3.00 |
| Vickerts Hardness (100 gm load) (kg/mm$^2$) | 665-738 | 745-877 | 320-357 | 288-384 |

Tungsten can be used for wafer probing on aluminum pads. Tungsten's hardness provides long probe life, and the spring characteristics are desirable for probe stability. Contact resistance is acceptable for most applications. Due to tungsten's fibrous nature, oxide crystals tend to become trapped in the probe tip, so cleaning may be needed to keep contact resistance at acceptable levels.

Tungsten-rhenium (e.g., 97% tungsten, 3% rhenium) has properties similar to tungsten, but it is not as fibrous and does not tend to trap oxide crystals. Contact resistance is higher than tungsten, but it is constant with time. Tungsten-rhenium may require less maintenance than tungsten, so its life expectancy is generally higher.

Beryllium-copper (BeCu) can be used where applications require low contact resistance or high current. Beryllium-copper is relatively soft. Thus, probe tips wear faster than other materials, but may be self-cleaning. Beryllium-copper probes are generally used in applications where hardness requirements are less stringent, such as gold pads.

Paliney® 7 (sold by Deringer-Ney Inc. in Vernon Hills, Ill.) contains gold, palladium, platinum, silver, copper, and zinc, and is harder than beryllium-copper. This alloy is expensive and may be used for applications that require low contact resistance and good conductivity. Thus, this alloy may be used for contacting gold pads.

Tungsten carbide has an even larger grain structure. This aids in oxide penetration for non-scrubbing tips, but increases contamination for scrubbing probes. Based on these properties, tungsten-rhenium may be used for scrubbing tips and tungsten carbide may be used for non-scrubbing probes.

Carbon nanotubes also can be used as the pins 102. Each pin 102 can be a single carbon nanotube. The nanotubes can be attached to a support arm or can be placed into appropriate sized holes. Wires can be attached to one end of the nanotube to facilitate the electrical measurement.

As seen in FIG. 3, each pin 102 is connected to an interconnect 103 in the body 101 of the resistivity probe 100. The pins 102, while extending from the body 101 to an equal distance, can extend to different depths into the body 101. Thus, the interconnects 103 may be at different depths within the body 101 so the interconnects 103 do not cross. In an instance, the pins 102 are tungsten and the interconnects 103 are tungsten or copper.

Figure 6A:
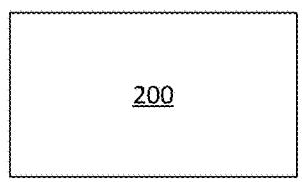
FIGS. 6A-6H illustrate a first embodiment of a manufacturing process of the resistivity probe of FIG. 1, wherein the pins can move relative to the probe body.
Figure 6B:
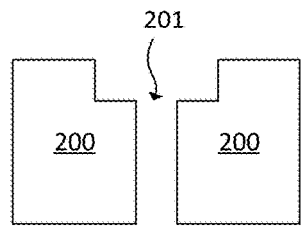
Figure 6C:
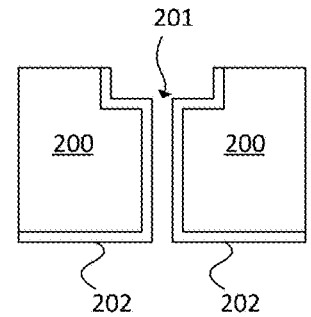
Figure 6D:
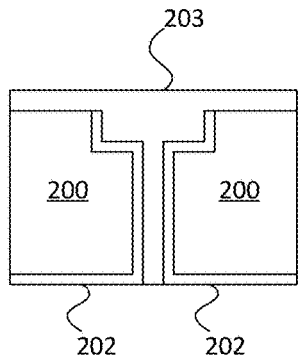
Figure 6E:
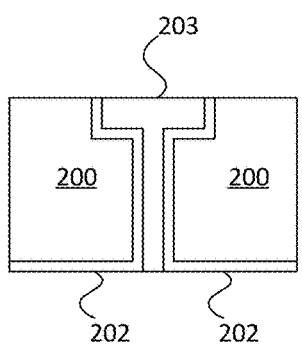
Figure 6F:
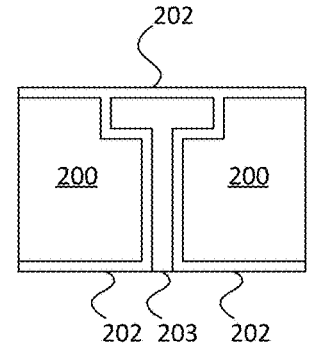
Figure 6G:
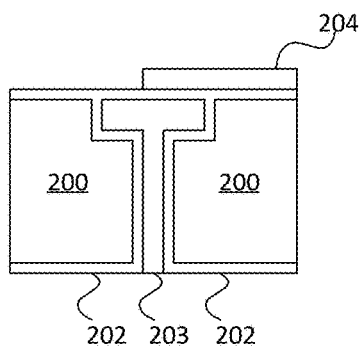
Figure 6H:
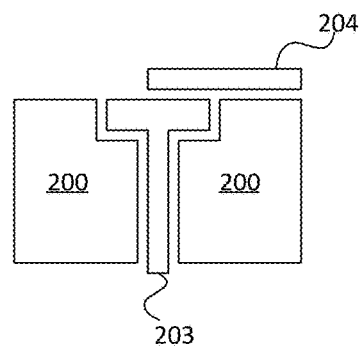

FIGS. 6A-6H illustrate a first embodiment of a manufacturing process of the resistivity probe of FIG. 1. In FIG. 6A, a substrate 200 is illustrated. A through hole 201 with two diameters is etched in the substrate 200 in FIG. 6B. Thus, the through hole 201 also includes a cap stop. A release layer 202 (e.g., SiO$_2$, photoresist, aerogel) is deposited on the through hole 201 and bottom of the base material of the substrate 200 in FIG. 6C. In FIG. 6D, metal 203 is deposited into the through hole 201. The metal 203 can be used to form a pin. In FIG. 6E, the top of the metal 203 is planarized, such as using chemical mechanical planarization. After the planarizing, the metal 203 may be flush with the base material of the substrate 200. A release layer 202 is added to the top of the substrate 200 in FIG. 6F. A conductor 204 (or conductor trace) is deposited on the release layer 202 in FIG. 6G. Depositing the conductor 204 may include a masking step (not illustrated). The conductor 204 can serve as an interconnect or spring. In FIG. 6H, the release layer 202 is etched, leaving the pin made of the metal 203 and the conductor 204 independent of one another. The tip of the metal 203 can be shaped as needed by etching. This technique may avoid the need for a lateral scrub. Air can be used as a primary load source or can be used to enhance or replace the primary load source.

Figure 7A:
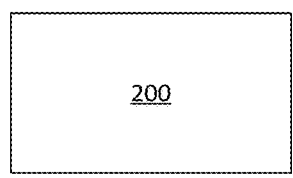
FIGS. 7A-7H illustrate a second embodiment of a manufacturing process of the resistivity probe of FIG. 1, wherein the pins can move relative to the probe body.
Figure 7B:
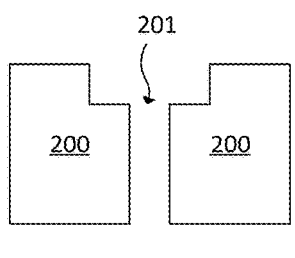
Figure 7C:
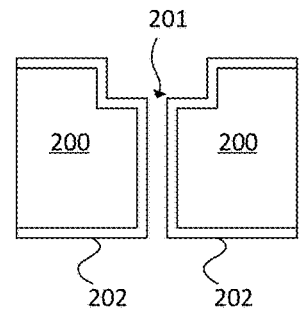
Figure 7D:
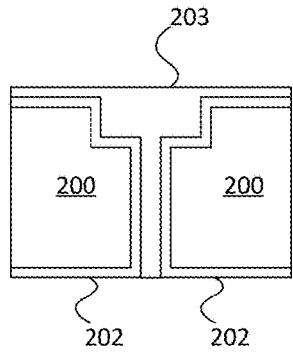
Figure 7E:
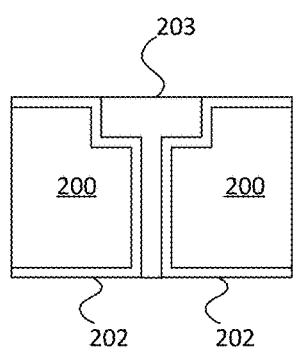
Figure 7F:
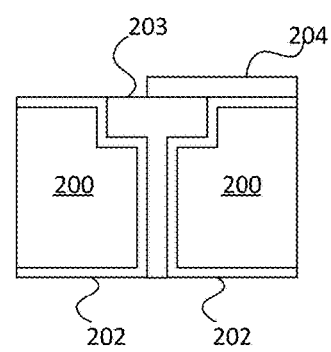
Figure 7G:
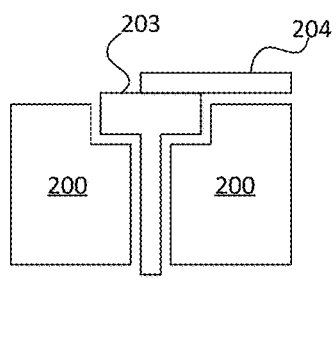
Figure 7H:
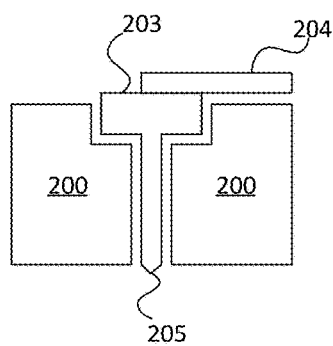

FIGS. 7A-7H illustrate a second embodiment of a manufacturing process of the resistivity probe of FIG. 1. In FIG. 7A, a substrate 200 is illustrated. A through hole 201 with two diameters is etched in the substrate 200 in FIG. 7B. Thus, the through hole 201 also includes a cap stop. A release layer 202 (e.g., SiO$_2$) is deposited on all surfaces of the base material of the substrate 200 in FIG. 7C. In FIG. 7D, metal 203 is deposited into the through hole 201. The metal 203 can be used to form a pin. In FIG. 7E, the top of the metal 203 is planarized, such as using chemical mechanical planarization. After the planarizing, the metal 203 may be flush with the base material of the substrate 200. In FIG. 7F, a conductor 204 (or conductor trace) is deposited on the metal 203 and release layer 202. Depositing the conductor 204 may include a masking step (not illustrated). The conductor 204 can serve as an interconnect or spring. In FIG. 7G, the release layer 202 is etched. The tip 205 of the metal 203 is etched in FIG. 7H. In this embodiment, the conductor 204 is disposed on the metal 203. This technique creates a lateral scrub. Air can be used as a primary load source. A chip using this design may be hermetically sealed.

Figure 8A:
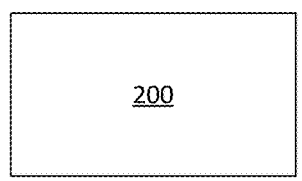
FIG. 8A-8I illustrate a third embodiment of a manufacturing process of the resistivity probe of FIG. 1.
Figure 8B:
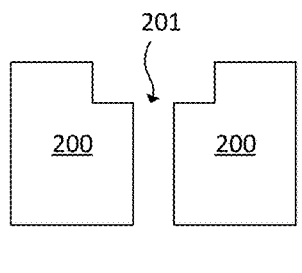
Figure 8C:
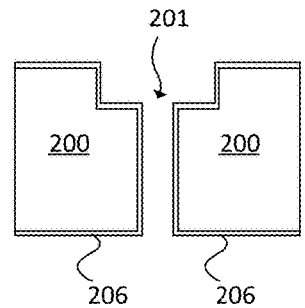
Figure 8D:
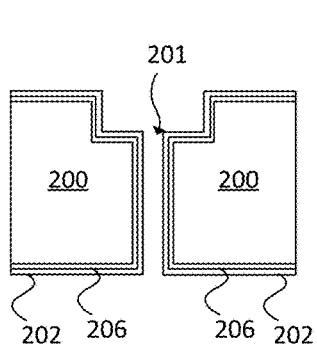
Figure 8E:
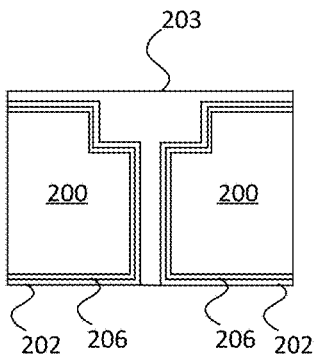
Figure 8F:
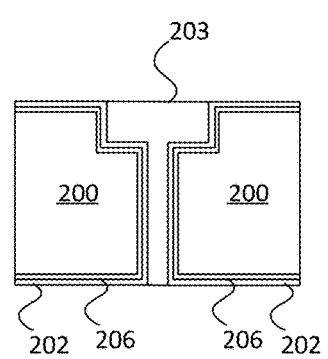
Figure 8G:
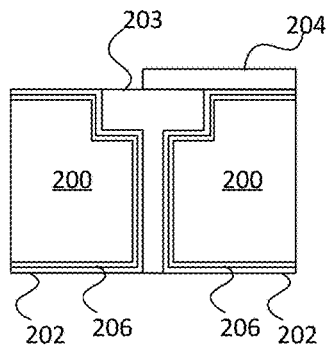
Figure 8H:
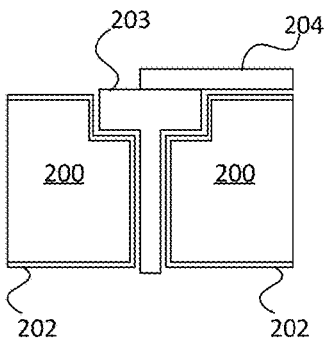
Figure 8I:
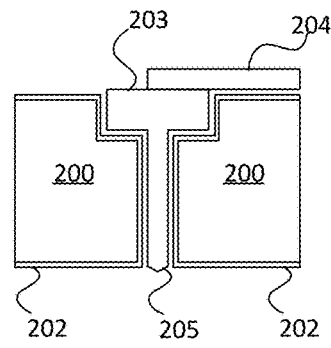

FIGS. 8A-8I illustrate a third embodiment of a manufacturing process of the resistivity probe of FIG. 1. In FIG. 8A, a substrate 200 is illustrated. A through hole 201 with two diameters is etched in the substrate 200 in FIG. 8B. Thus, the through hole 201 also includes a cap stop. An insulator 206 (e.g., SiO$_2$) is deposited on all surfaces of the base material of the substrate 200 in FIG. 8C. A release layer 202 (e.g., SiO$_2$) is deposited on the insulator 206 in FIG. 8D. In FIG. 8E, metal 203 is deposited into the through hole 201. The metal 203 can be used to form a pin. In FIG. 8F, the top of the metal 203 is planarized, such as using chemical mechanical planarization. After the planarizing, the metal 203 may be flush with the base material of the substrate 200. In FIG. 8G, a conductor 204 (or conductor trace) is deposited on the metal 203 and release layer 202. Depositing the conductor 204 may include a masking step (not illustrated). The conductor 204 can serve as an interconnect or spring. In FIG. 8H, the release layer 202 is etched. The tip 205 of the metal 203 is etched in FIG. 8I. A metal layer for shielding or grounding may be added with the insulator layer. Air can be used as a primary load source. A chip using this design may be hermetically sealed.

In the embodiment of FIG. 8, the body of the substrate 200 may be grounded. The surrounding body may be isolated from the common body. For example, the conductor 204 may be connected to the body of the substrate 200. A grounding layer also may surround the metal 203.

In the embodiments of FIGS. 6-8, the through hole 201 is an example of a via in FIG. 1. However, the vias in FIG. 1 do not necessarily extend through the entire body of the probe.

Figure 9:
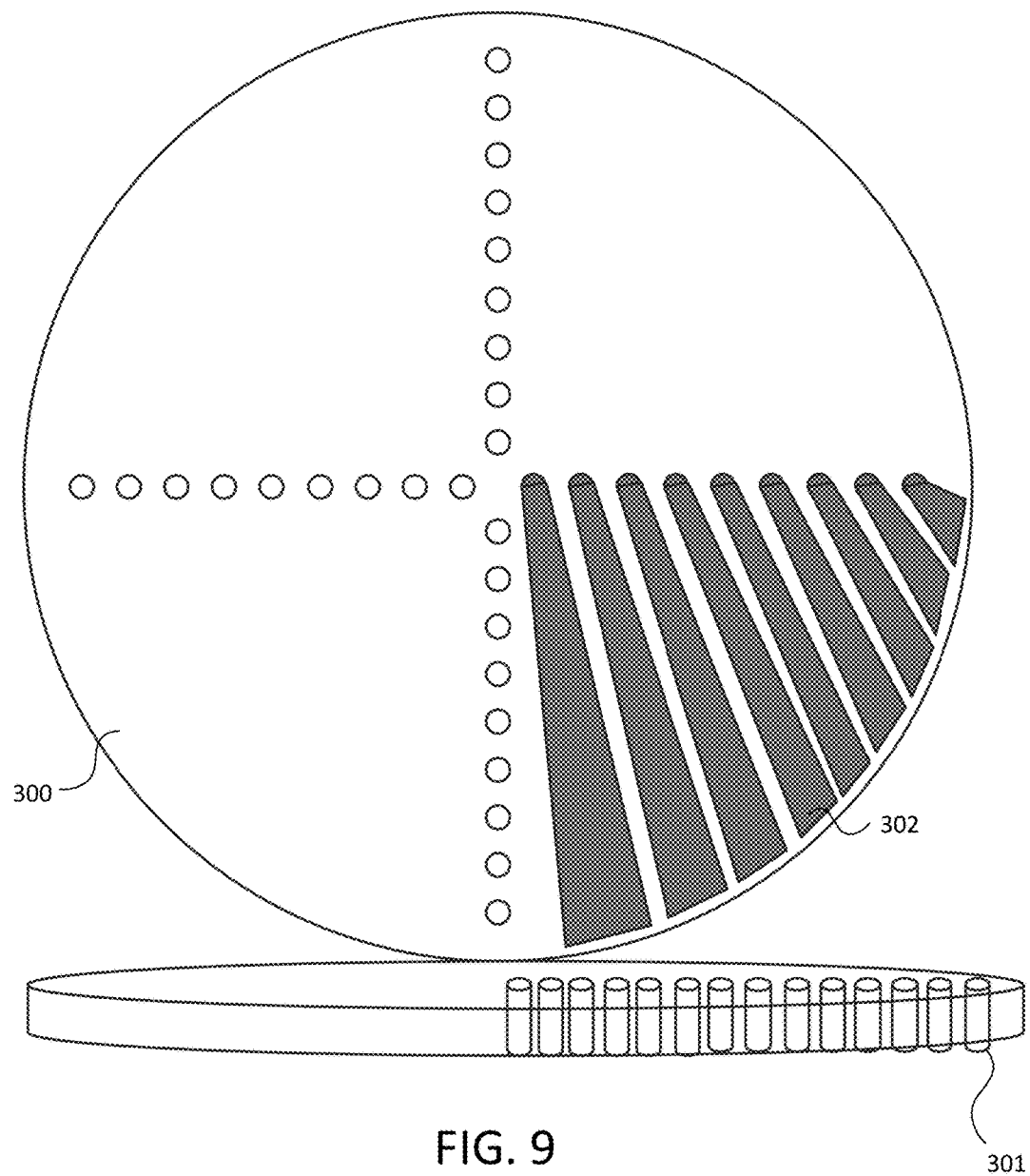
FIG. 9 illustrates a substrate with a quadrant populated.

FIG. 9 illustrates a substrate with a quadrant populated. The embodiment of FIG. 9 can provide moving pins 301. In this single quarter populated embodiment, the substrate 300 is silicon but could be another material. The pins 301 can be tungsten carbide or other materials. The conductor lines 302 can be tungsten carbide or other materials. The conductor lines 302 can act as springs. The pins 301 and any springs can include a release layer (e.g., SiO$_2$) that can be etched away. The spring dimensions can vary to match a spring constant. The pins 301 and springs can be deposited in one step or can be deposited in three steps if a release layer is etched away. Etching the release layer away leaves the springs and pins 302 as independent, which can relieve lateral stress. The conductor lines 302 may be configured to be perpendicular to the circularly, flat surface of the substrate 300. The pins 301 may not be flexible, though the springs may be flexible.

Figure 10:
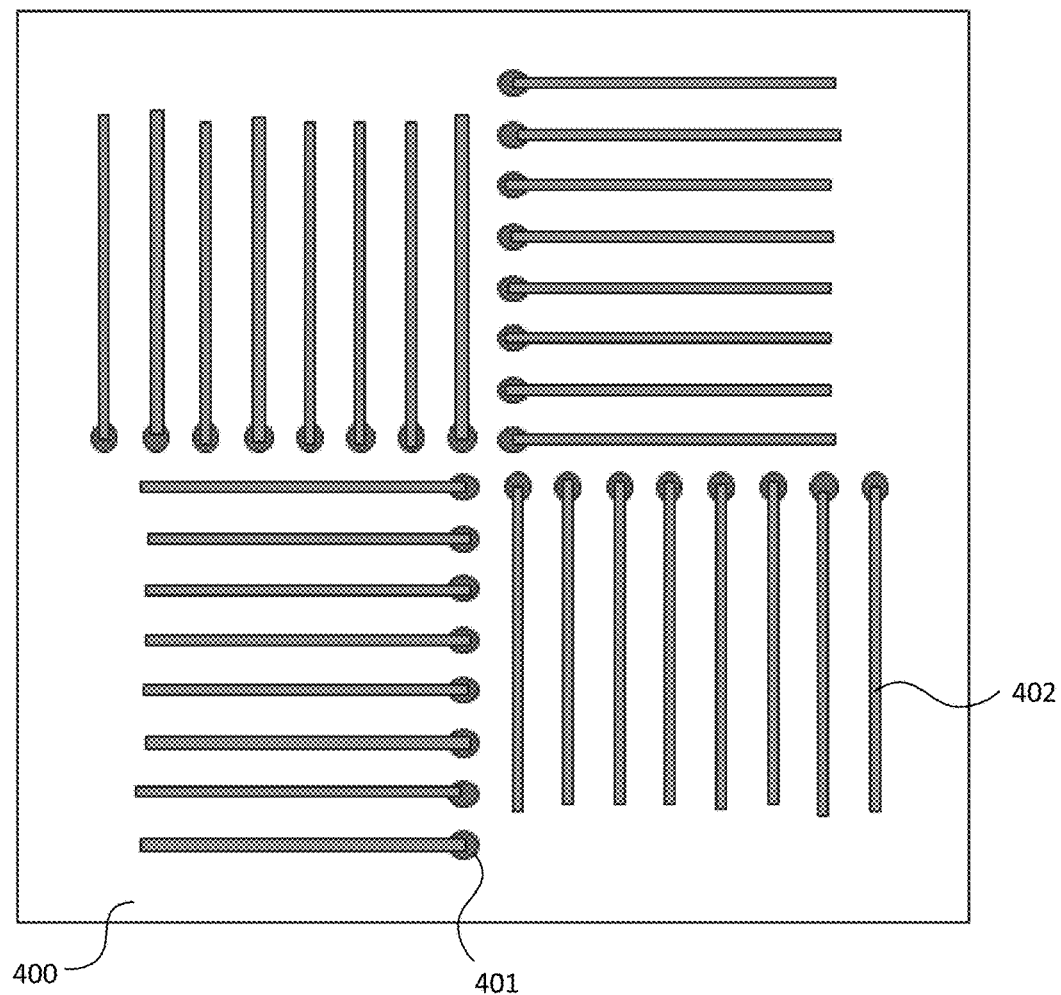
FIG. 10 illustrates a linear array.

FIG. 10 illustrates a square or linear array. The substrate 400 is silicon or can be another material. The pins 401, which can move, can be tungsten carbide or other materials. The conductor lines 402 can be copper or other materials. The pins 401 and any springs can include a release layer (e.g., $SiO_2$) that can be etched away. The pin 401 loading may be entirely by air pressure. The backside of the substrate 400 may be coated with a sacrificial layer to create a pin extension. The wire traces of the conductor lines 402 can bend, but may not provide spring action. This embodiment can include curved elements that are not parallel to the supporting surface for their entire length.

Figure 11:
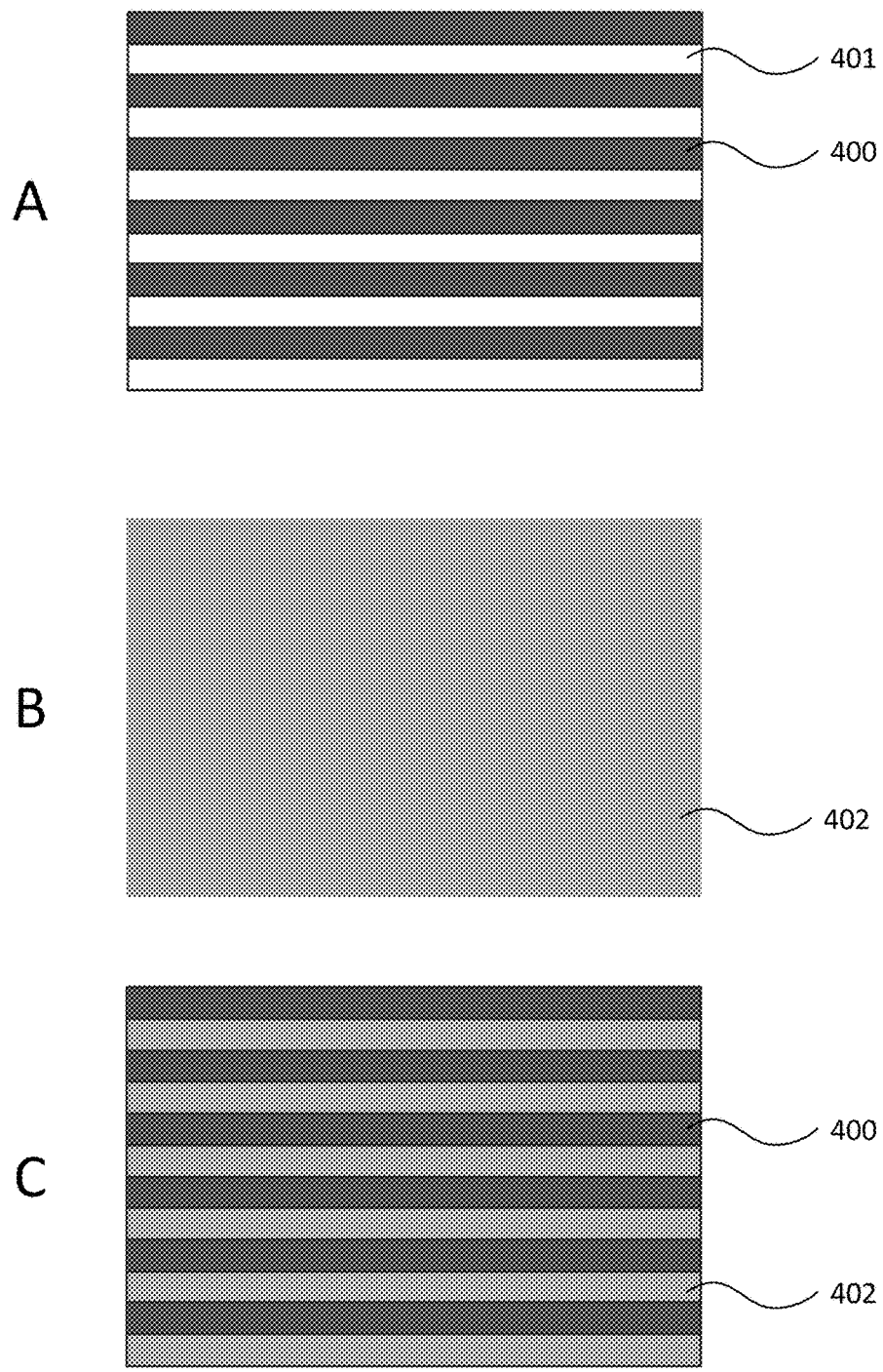
FIG. 11 illustrates another embodiment of a manufacturing process for part of a resistivity probe.
Figure 12:
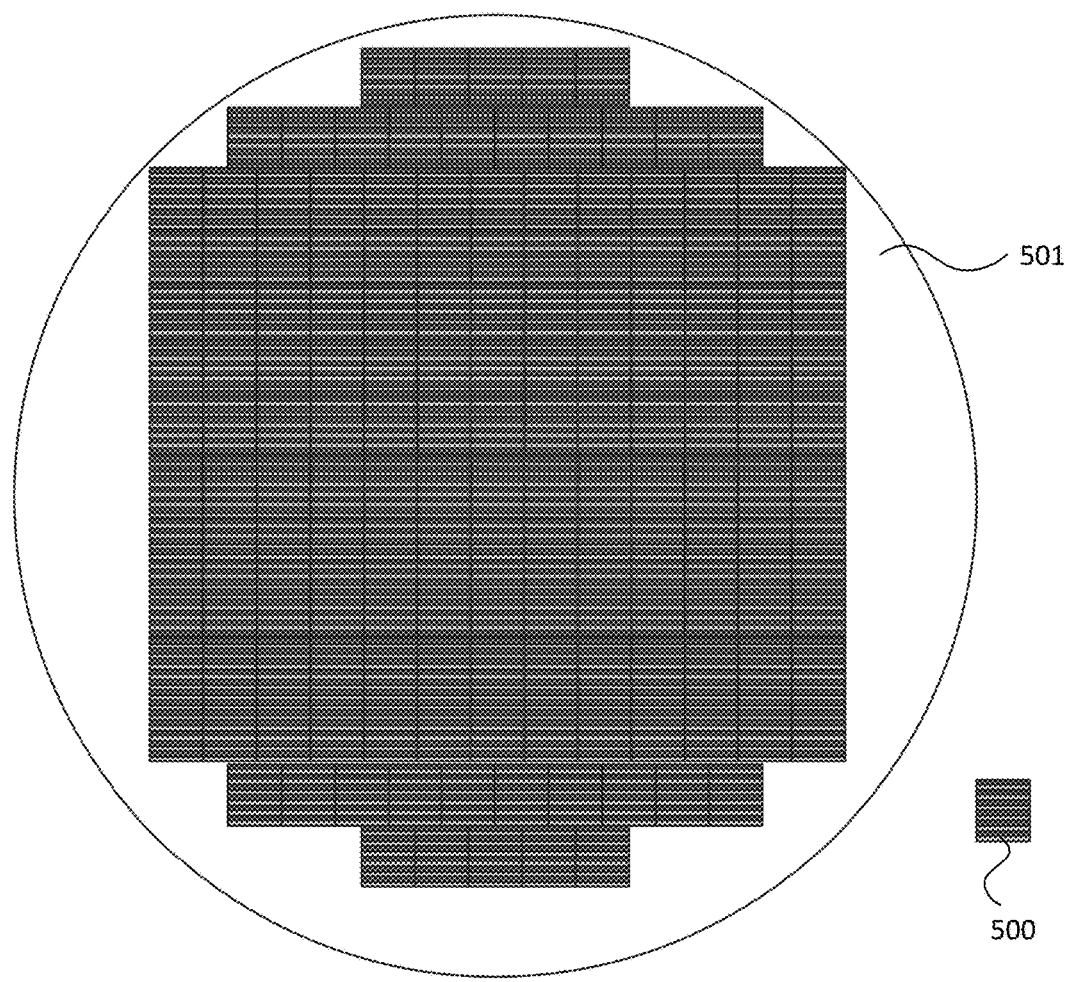
FIG. 12 is a top view of a chip probe wafer.

FIG. 11 illustrates another embodiment of a manufacturing process for part of a resistivity probe. FIG. 11 is a top view of a substrate surface. In FIG. 11A, a metal 400 is deposited and trenches 401 are etched in the surface. The set of metal lines of the metal 400 may be, for example, 1 μm by 1 μm. In FIG. 11B, an insulator 402 is deposited to overfill the trenches 401. Then a metal 400 is deposited on the insulator 402 and trenches are etched in the surface in FIG. 11C. This forms a second set of metal lines of the metal 400, which may be, for example, 1 μm by 1 μm. This process can be repeated to create a stack of conductors to equal the width of the conductors. When the chips from FIG. 12 are rotated 90 degrees, the chip should look like FIG. 13. Whereas other processes create the pins perpendicular to the wafer surface, these pins are in the same plane as the wafer surface.

FIG. 12 is a top view of a chip probe wafer. The substrate 501 includes multiple chip probes 500. Each of the chip probes 500 may be manufactured using the process illustrated in FIG. 11.

Figure 13:
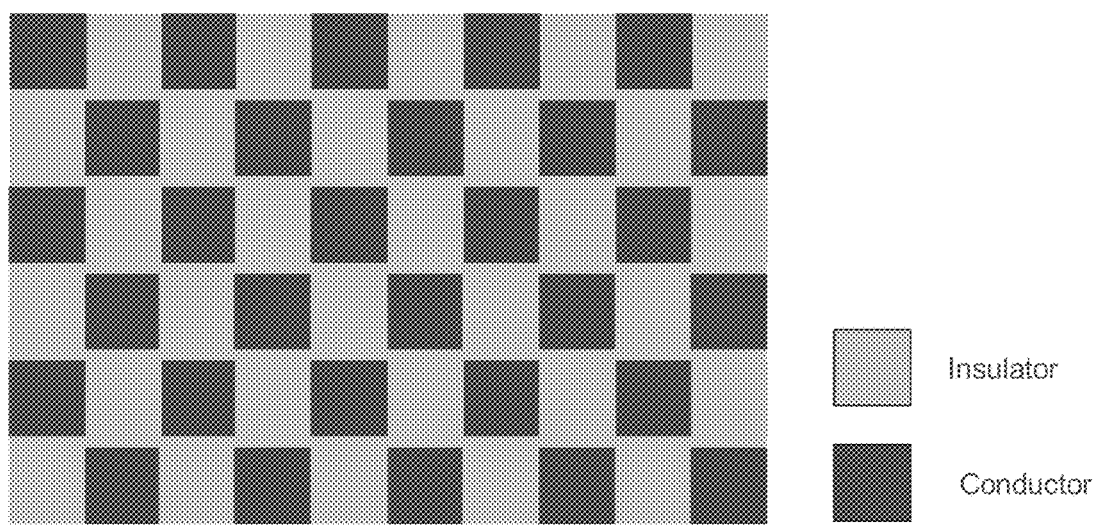
FIG. 13 is a diagram of a checkerboard chip probe.

FIG. 13 is a diagram of a checkerboard chip probe, which can be formed using the technique for FIG. 11 or by other techniques, such as a damascene process with chemical mechanical planarization. The pattern in FIG. 13 is created by depositing metal layer, etching lines, over filling, and repeating. One end can be etched to expose a portion of the metal rods. After matrix completion, conductor blocks are wire bonded at ends. High current can be used to heat pins, which expand and compress the insulator. Upon cooling, the wires shrink and separate from the insulator. Note that the insulator squares may be slightly larger than the conductor squares, which means that the conductor squares may not touch each other. A design such as that illustrated in FIG. 13 may be used on the bottom surface of, for example, the resistivity probe of FIG. 1. In this example, the conductor squares extend further from the surface than the insulator squares, which provides pins.

Figure 14:
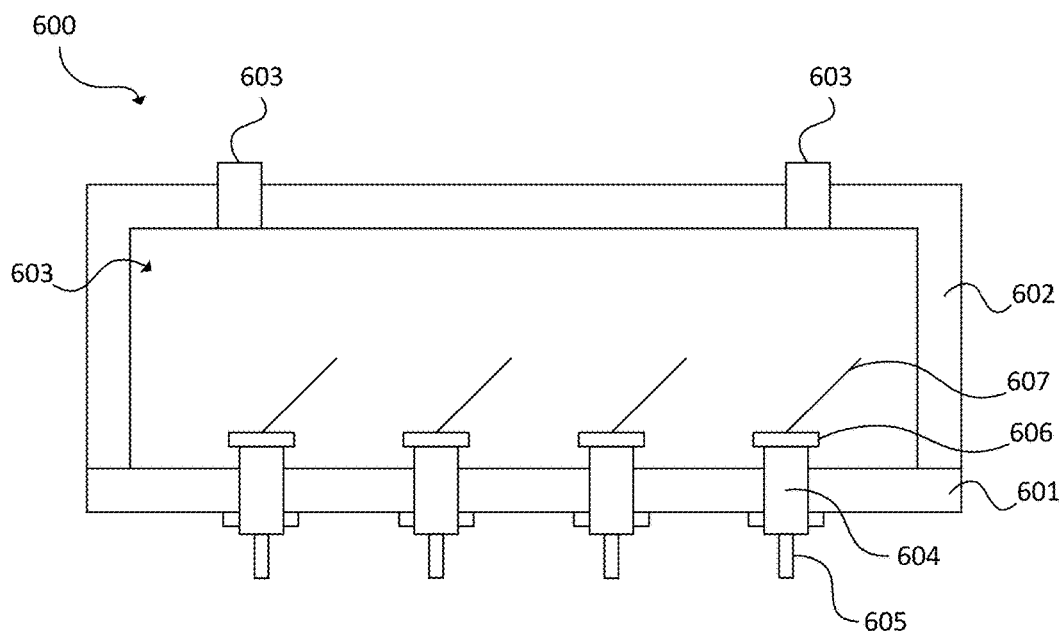
FIG. 14 is a cross-sectional block diagram of a probe head.

FIG. 14 is a cross-sectional block diagram of a probe head 600. The probe head 600 includes an insulator 601 and a cover 602. The cover 602 completely encloses a cavity 603. Two inlets/outlets 603 are illustrated. These can provide and remove a fluid, such as clean, dry air.

Four needle bodies 604 are included. More or fewer needle bodies 604 can be included. Each needle body 604 has a blunt needle tip. Each needle body 604 also includes a shoulder 606, which can limit movement, and a conductive wire 607 in electronic communication with the needle 605. The needle bodies 604 can move within a hole in the insulator 601, such that the length which the needle bodies 604 extend from the insulator 601 can vary.

The fluid can be supplied with a controlled pressure and speed uniformly across all needle bodies 604. For example, the load acting upon the needle bodies 604 can range from 0 kg/cm² to approximately 6 kg/cm². Unlike a conventional spring probe, the load may not decrease with a worn probe using the embodiment of FIG. 14. The fluid can either push the needle bodies 604 or can serve as a cushion or spring when the needle bodies 604 are pushed into the cavity 603.

Using air pressure or pressure from another fluid can provide consistent force per pin. Use of pressure from air or another fluid can compensate for the tip surface changes (e.g., coned and rounded tips) as surface area increases and pressure per unit area decreases.

While illustrated with the pins 605, any of the pin embodiments disclosed herein can be used. In an instance where air pressure is used the enclosure may be sealed. In another instance a metal spring is used and the enclosure is not sealed. In fixed pin designs the block holding the pins could be spring-loaded. In an embodiment, both pins and block are fixed and the weight of the probe can determine the contact pressure.

Figure 15:
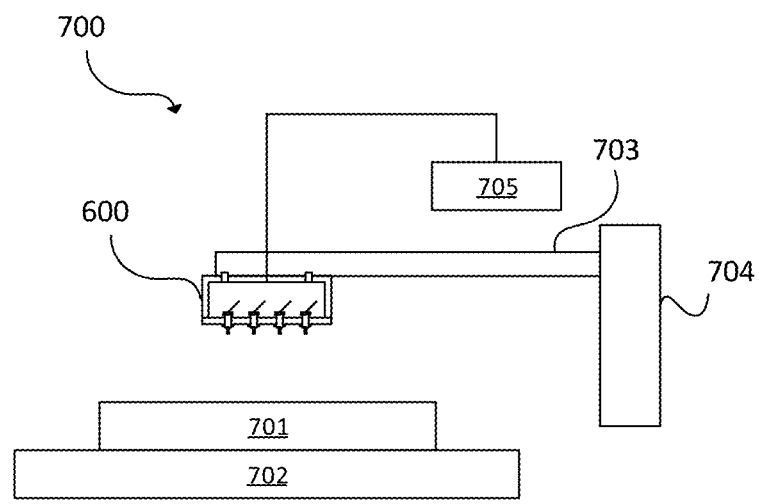
FIG. 15 is block diagram of a probe head on a control arm.

FIG. 15 is block diagram of a probe head 600 on a control arm 703. In the system 700, the probe head 600 is positioned above a wafer 701 that is disposed on a platen 702. The actuator 704 can move the control arm 703 and, consequently, the probe head 600 toward and away from the wafer 703. The probe head 600 also is in electronic communication with a control system 705 that can determine resistivity based on readings from the probe head 600.

During operation, a current may be passed between two pins on the probe head 600 and a voltage is measured between the other two pins on the probe head 600. The pins of the probe head 600 may be arranged in a single row or in multiple rows.

While the probe head of FIG. 14 is illustrated on the control arm 703, other probes can be used. For example, the probe 100 of FIG. 1 or the probe of FIG. 18 can be used with the control arm 703.

Figure 16:
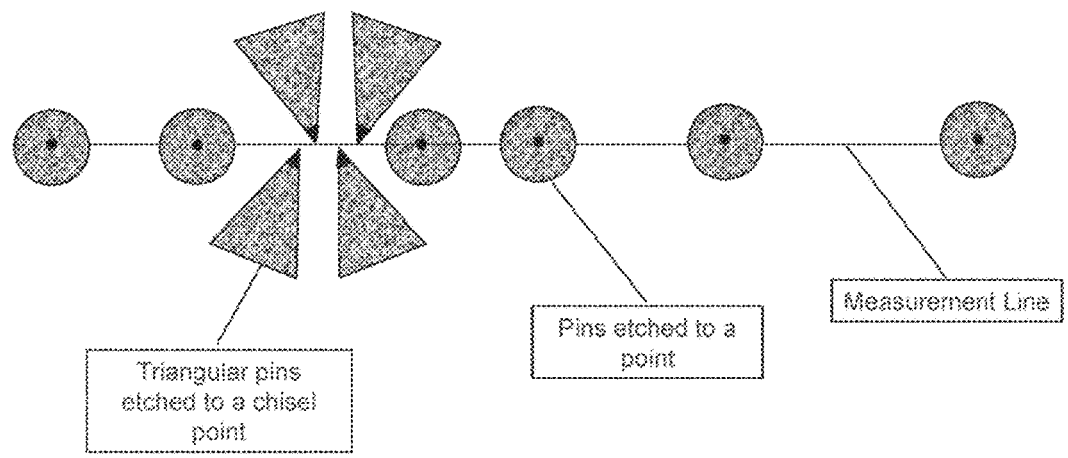
FIG. 16 illustrates a bottom view of variable-shaped probe pins.
Figure 17:
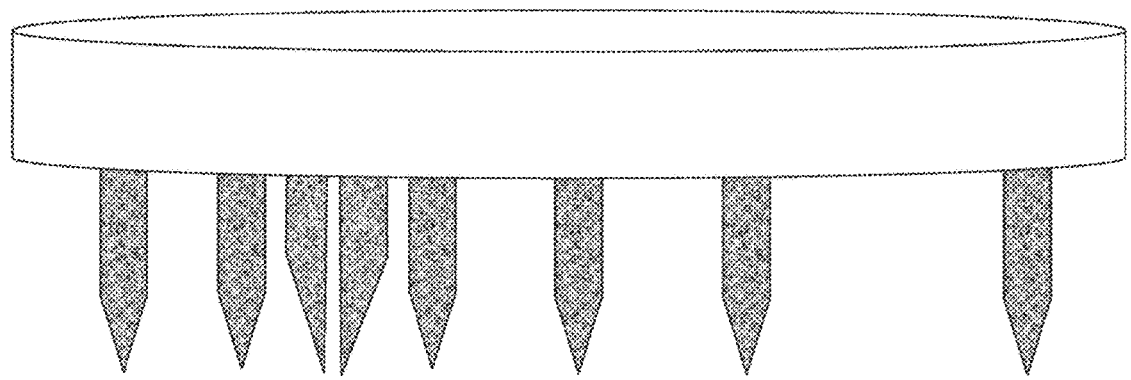
FIG. 17 illustrates a side view of the variable-shaped probe pins of FIG. 16.

FIG. 16 illustrates a bottom view of variable-shaped probe pins. FIG. 17 illustrates a side view of the variable-shaped probe pins of FIG. 16. Variable shaped pins can provide closer pin spacing compared to round pins that have a point in the center. In an instance, holes (including triangular holes) are etched and metal is deposited in the holes. This arrangement can be used to replace pins in any embodiment disclosed herein where all pins are identical shape.

Figure 18:
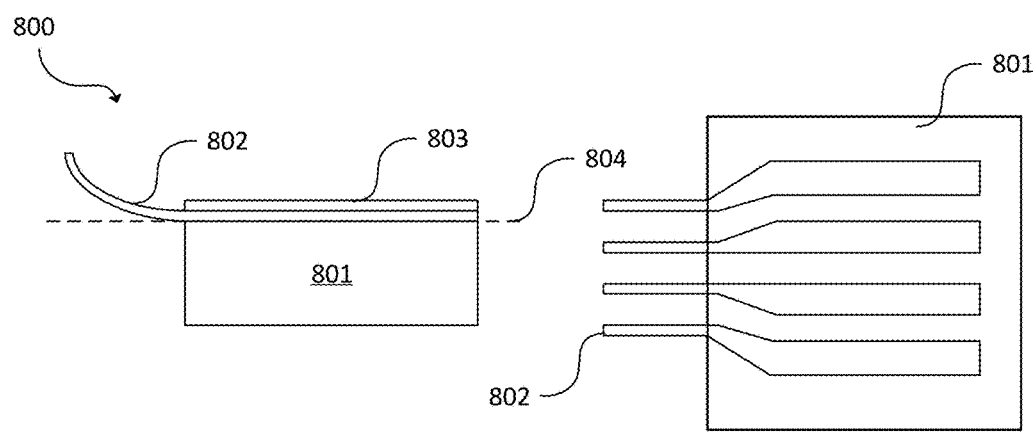
FIG. 18 illustrates a second embodiment of a resistivity probe in accordance with the present disclosure showing cross-sectional and corresponding top views.

FIG. 18 illustrates a second embodiment of a resistivity probe 800 showing cross-sectional and corresponding top views. This resistivity probe 800 can achieve long lifetime performance for multiple pin micro probes for measurement of sheet resistance, tunneling resistance in MRAM, or other film properties. The probes 802 are curved so that the elements are not parallel to a supporting surface (shown with dotted line 804) of the substrate 801 along their entire length. Dimensions of the elements and/or spacing may be sub-micron. The substrate 801 may be silicon and the probes 802 and layer 803 may be any metal or metal alloy disclosed herein. While four probes 802 are illustrated, more or fewer may be used. The resistivity probe 800 can improve on-contact area stability, reduce possibility of damaging test wafer surface, and prolong the lifetime of probe.

By having probes 802 extend out non-parallel to the supporting surface to form a curved cantilever, especially near the tip free end, the contact angle is increased. This causes less contact area between a sample surface and the probe 802 during landing at the same amount of overdrive toward a wafer surface.

In an instance, the angle of the probe 802 relative to the support surface can be made close to 90° (referring to the supporting body angle and total tip curved angle). By removing the non-conductive supporting cantilever material (e.g., the substrate 801), the contact area can be determined by the cross section of the cantilevered probe 802, which can be formed by the conductive materials (or layered conductive materials). Thus, the contact area can be kept at a constant size, even during the wearing process, which improves measurement precision and the total lifetime of the probe.

Layered conductive materials can contain both soft and hard conductive materials to achieve both good contact and ability to penetrate surface oxide layer. The probes 802 may not include non-conductive support materials proximate the tips.

The substrate 801 (e.g., $SiO_2$) may be etched from the probes 802. By removing the substrate 801 (e.g., a support region) or another supporting non-conductive material, the stress is released so the conductive probe 802 can be curved yet conformal to each other. This can enable simultaneously landing onto a wafer surface.

Figure 19A:
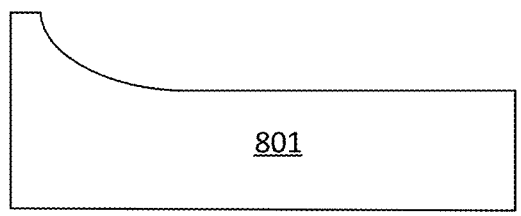
FIGS. 19A-19E illustrate an embodiment of a manufacturing process for part of the resistivity probe of FIG. 18.
Figure 19B:
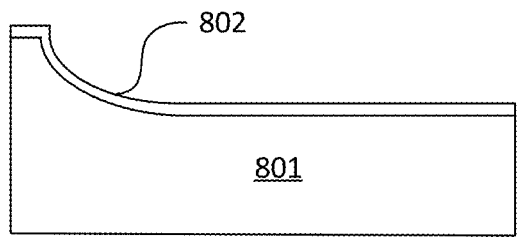
Figure 19C:
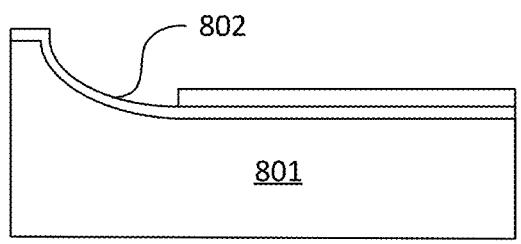
Figure 19D:
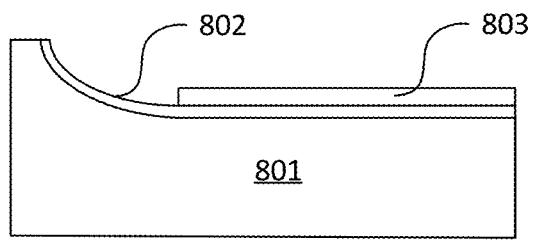
Figure 19E:
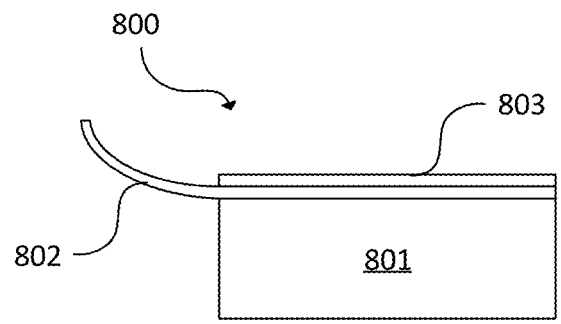

FIGS. 19A-19E illustrate an embodiment of a manufacturing process for part of the resistivity probe of FIG. 18. In FIG. 19A, a substrate 801 (e.g., a glass plate) is molded. In FIG. 19B, a metal layer that forms the probes 801 is deposited. In FIG. 19C, a metal layer 803 is deposited. A mask also may be deposited. In FIG. 19D, the probes 801 are etched. In FIG. 19E, the support region of the substrate 801 is etched.

Figure 20A:
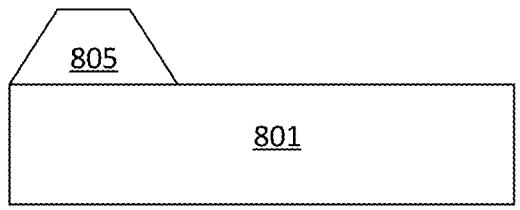
FIGS. 20A-20E illustrate another embodiment of a manufacturing process for part of the resistivity probe of FIG. 18.
Figure 20B:
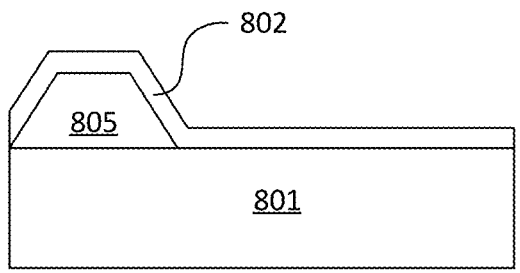
Figure 20C:
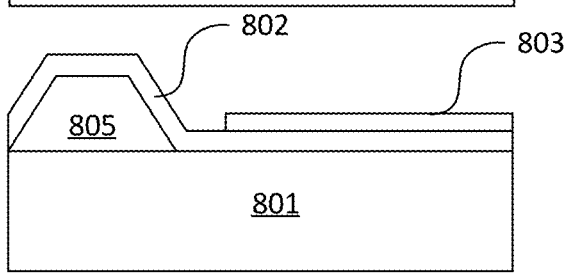
Figure 20D:
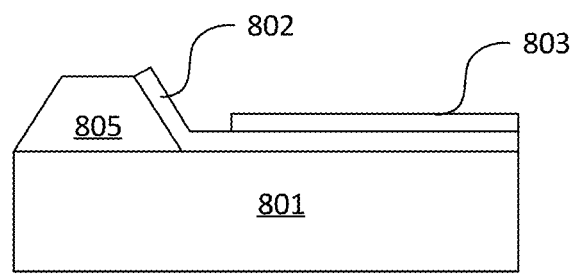
Figure 20E:
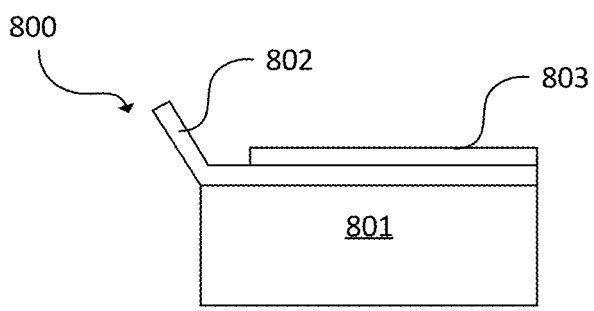

FIGS. 20A-20E illustrate another embodiment of a manufacturing process for part of the resistivity probe of FIG. 18. In FIG. 20A, photoresist 805 is deposited on the substrate 801 at a controlled angle. In FIG. 20B, a metal layer that forms the probes 801 is deposited. In FIG. 20C, a metal layer 803 is deposited. A mask also may be deposited. In FIG. 20D, the probes 801 are etched. In FIG. 20E, the support region of the substrate 801 and the photoresist 805 are etched and/or otherwise removed. While illustrated as angular, the photoresist 805 can be deposited in a manner to provide a curve. Thus, the embodiment of FIGS. 20A-20E can be used to form curved probes 801 as well as angular probes 801.

In yet another embodiment, two layers of the material may be included in the probes 802. Due to different stresses between the layers, the probes 802 will curl when the substrate 801 is etched away from the probes 802. The other layer of material may be an insulator, such as $SiO_2$, silicon nitride, or silicon.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A resistivity probe comprising:
a substrate defining a plurality of vias;
a plurality of metal pins in one or more rows, wherein each of the metal pins is disposed in one of the vias, and wherein each of the metal pins extends out of the substrate;
a plurality of needle bodies, wherein each of the metal pins is disposed on one of the needle bodies, wherein each of the needle bodies includes a main body and a shoulder portion;
a plurality of conductive wires, wherein each of the conductive wires is disposed on one of the needle bodies;
an enclosure, wherein each of the needle bodies is positioned to extend through a wall of the enclosure;
a plurality of interconnects in the substrate, wherein the interconnects are connected to the conductive wires, and wherein the interconnects provide an electrical connection to the conductive wires; and
a fluid source configured to direct a fluid into the enclosure, wherein the needle bodies are configured to move through the enclosure upon exposure to the fluid, and wherein one of the shoulders is configured to halt movement of the needle body that the shoulder is disposed on.

2. The resistivity probe of claim 1, wherein the metal pins are fabricated of tungsten, tungsten carbide, a tungsten-rhenium alloy, a beryllium-copper alloy, or an alloy containing gold, palladium, platinum, silver, copper, and zinc.

3. The resistivity probe of claim 1, further comprising a plurality of springs, wherein each of the metal pins includes one of the springs.

4. The resistivity probe of claim 1, wherein the metal pins are in an array having at least two of the rows, and wherein each of the rows includes at least two of the metal pins.

5. The resistivity probe of claim 1, further comprising an arm, wherein the enclosure is disposed on the arm.

6. The resistivity probe of claim 5, further comprising a platen configured to hold a wafer thereon, wherein the arm is configured to move the enclosure toward and away from the platen.

7. The resistivity probe of claim 1, further comprising an arm, wherein the substrate is disposed on the arm.

8. The resistivity probe of claim 7, further comprising a platen configured to hold a wafer thereon, wherein the arm is configured to move the substrate toward and away from the platen.

* * * * *